(12) United States Patent
Khandelwal et al.

(10) Patent No.: US 9,362,756 B2
(45) Date of Patent: *Jun. 7, 2016

(54) CIRCUIT AND ARCHITECTURE FOR A DEMODULATOR FOR A WIRELESS POWER TRANSFER SYSTEM AND METHOD THEREFOR

(71) Applicant: Texas Instruments Incorporated, Dallas, TX (US)

(72) Inventors: Ashish Khandelwal, Irving, TX (US); Yipeng Su, Blacksburg, VA (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 14/502,378

(22) Filed: Sep. 30, 2014

(65) Prior Publication Data

US 2015/0171932 A1 Jun. 18, 2015

Related U.S. Application Data

(60) Provisional application No. 61/916,643, filed on Dec. 16, 2013, provisional application No. 61/916,655, filed on Dec. 16, 2013, provisional application No. 61/916,669, filed on Dec. 16, 2013.

(51) Int. Cl.
*H04B 5/00* (2006.01)
*H02J 5/00* (2016.01)
*H03K 19/20* (2006.01)
*H04B 5/02* (2006.01)
*H02J 7/02* (2016.01)

(52) U.S. Cl.
CPC ............ *H02J 5/005* (2013.01); *H02J 7/025* (2013.01); *H03K 19/20* (2013.01); *H04B 5/0093* (2013.01); *H04B 5/02* (2013.01); *H04B 5/0031* (2013.01); *H04B 5/0037* (2013.01)

(58) Field of Classification Search
USPC ........... 455/41.1; 340/10.1, 10.3, 10.34, 10.4, 340/13.24, 13.25, 13.26
See application file for complete search history.

(56) References Cited

U.S. PATENT DOCUMENTS

| 5,504,485 | A  | * | 4/1996 | Landt | G06K 7/0008 342/42 |
| 8,179,088 | B2 | * | 5/2012 | Takaishi | G06K 7/0008 320/107 |
| 8,669,678 | B2 | * | 3/2014 | Urano | H02J 5/005 307/104 |
| 9,041,254 | B2 | * | 5/2015 | Lisuwandi | H02J 5/005 307/104 |

(Continued)

*Primary Examiner* — Tuan A Tran
(74) *Attorney, Agent, or Firm* — William B. Kempler; Frank D. Cimino

(57) ABSTRACT

A primary side wireless power transmitter inductively couplable to a secondary side wireless power receiver for receiving communications from the secondary side wireless power receiver through the inductive coupling having a primary side tank circuit receiving a signal from the secondary side wireless power receiver. A phase delay or time delay circuit generates a fixed delay clock signal from a signal utilized to excite the primary side tank circuit. A sample and hold circuit samples a tank circuit voltage utilizing the fixed phase or time delayed clock signal. A comparator is coupled to an output of the sample and hold circuit for extracting data or commands from the signal stream. A method of operating a primary side wireless transmitter inductively coupled to a secondary side wireless power receiver for supplying power to the wireless power receiver to power a load coupled to the receiver is also disclosed.

20 Claims, 5 Drawing Sheets

(56) References Cited

U.S. PATENT DOCUMENTS

| | | | |
|---|---|---|---|
| 9,112,364 B2* | 8/2015 | Partovi | H02J 7/025 |
| 2012/0212068 A1* | 8/2012 | Urano | H02J 5/005 307/104 |
| 2013/0154373 A1* | 6/2013 | Lisuwandi | H02J 5/005 307/34 |
| 2014/0106826 A1* | 4/2014 | Yeo | H02J 5/005 455/573 |
| 2014/0191568 A1* | 7/2014 | Partovi | H02J 7/025 307/9.1 |
| 2014/0368050 A1* | 12/2014 | Chun | H04B 5/0037 307/104 |
| 2015/0108847 A1* | 4/2015 | Taylor | H04B 5/0037 307/104 |

* cited by examiner

CIRCUIT AND ARCHITECTURE FOR A DEMODULATOR FOR A WIRELESS POWER TRANSFER SYSTEM AND METHOD THEREFOR

CROSS-REFERENCE TO RELATED APPLICATIONS

This patent application claims priority from U.S. Provisional Application No. 61/916,643, filed Dec. 16, 2013; U.S. Provisional Application No. 61/916,655; and U.S. Provisional Application No. 61/916,669 filed Dec. 16, 2013, which are incorporated herein by reference in their entirety for all purposes. This application is related to U.S. application Ser. No. 14/501,850, filed Sep. 30, 2014; U.S. patent application Ser. No. 14/502,048, filed Sep. 30, 2014, filed on even date, which are incorporated herein by reference in their entirety for all purposes.

FIELD

The invention relates to recovery of data or commands in a signal stream received from a wireless power receiver in a wireless power transmitter.

BACKGROUND

The explosion of small portable electronic devices such as cell phones has led to the desire to be able to recharge the device without the necessity of attaching a cord to the device. A solution that accomplishes this task is known as "wireless power". The term "wireless power" as utilized herein refers to the transmission of electrical energy from a power source to an electrical load without interconnecting wires. A common form for wireless power transmission utilizes two electromagnetically coupled coils to form a transformer through which power is transferred from the primary side to the receiving side. The transmitter may take the form of a pad having a coil embedded therein. The receiver may be built into a cellular telephone, for example, with the receiving side coil built into the back thereof. Although there is no direct contact between the transmitting and receiving coils, the close proximity of the coils and the judicious use of shielding allows for efficient transfer of energy from the transmitting side to the receiving side to operate a load, which may be a rechargeable battery being recharged by the system, for example.

FIG. 1 shows a block diagram of a prior art wireless power transmission system, generally as 100. The system comprises a transmitter side 102 and a receiver side 122. The transmitter side 102 comprises a circuit 104 for rectifying an AC input into a DC voltage which is fed into a power stage 106 for generating a high frequency signal. The high-frequency signal is coupled across a transformer 120 to the receiver side 122. The power stage 106 is controlled by controller 108 which could be combined into a single integrated circuit with the power stage 106. The receiver side 122 comprises a rectifier circuit 124 to output a DC voltage and a voltage conditioning circuit 126 which is operated by the receiver controller 128 to supply power to a load 130, which may be a rechargeable battery being recharged by the system, for example.

As shown FIG. 1, power flows from left to right from the transmitter to the receiver and communications flows from right to left from the receiver to the transmitter. The communication signals may be command signals to adjust the power level from the transmitter or other parameters, for example. The communication signals may be generated by coupling a resistor or capacitor across the receiving coil to generate signals which can be recognized by the controller on the transmitting side. The low-level signals are noisy because of the noise generated by the power transmission portion of the system.

The Wireless Power Consortium (WPC) defines a standard for such wireless power transmission. In a WPC defined wireless charging system, the power transmitter detects the signal from the power receiver as a modulation of current through and/or voltage across the primary circuit through a V/I circuit 110. In other words, the power receiver and the power transmitter use amplitude modulated power signals to provide a power receiver to power transmitter communication channel.

The WPC defined communication channel assumes that the incoming power signal is always amplitude modulated. However, that may not be a valid assumption. Accordingly, there is a need for a reliable, low-cost and easily integratable solution for detecting information being sent from the receiver to the transmitter in a wireless power system.

SUMMARY

It is a general object of the invention to provide for recovery of data or commands in a signal stream in a wireless power transmitter.

In an aspect, in a primary side wireless power transmitter for being inductively coupled to a secondary side wireless power receiver for supplying power to the wireless power receiver to power a load coupled to the wireless power receiver, a primary side control for receiving communications from the secondary side wireless power receiver through the inductive coupling comprises a primary side tank circuit being excited into oscillation by an excitation signal, the tank circuit receiving a signal from the secondary side wireless power receiver. A delay circuit generates a fixed delay clock signal from the excitation signal. A sample and hold circuit samples a tank circuit voltage utilizing the fixed delayed clock signal. A comparator is coupled to an output of the sample and hold circuit for extracting data or commands from the signal stream.

In an aspect, a method of operating a primary side wireless transmitter inductively coupled to a secondary side wireless power receiver for supplying power to the wireless power receiver to power a load coupled to the receiver comprises exciting a tank circuit into oscillation utilizing an excitation signal. A signal stream is received from the wireless power receiver in a primary side tank circuit. A fixed delay clock signal is generated. The tank circuit voltage is sampled utilizing the fixed delayed clock in holding the sample value. A threshold voltage signal is generated from the signal stream signal. Data is extracted from the signal stream utilizing the threshold voltage signal.

In an aspect, a wireless power transfer system comprises a transmitter for transmitting electrical energy through a first inductive coil electromagnetically coupled to a second inductive coil and a receiver. A circuit in the receiver couples a resistor or capacitor across the second inductive coil to generate data or command signals in the first inductive coil. A sample and hold circuit samples a value of signal in the first inductive coil and holds the value, the sample being taken at a fixed delay from the excitation signal for the first coil. A comparator coupled to an output of the sample and hold circuit extracts data or commands from a signal stream.

BRIEF DESCRIPTION OF DRAWINGS

Further aspects of the invention will appear from the appending claims and from the following detailed description given with reference to the appending drawings.

DETAILED DESCRIPTION

In order to have a reliable communication channel, the system must tolerate system parameter variations including variations in the coupling coefficient (K) of between 0.2 and 0.7, and variation in the receiver load from 5 ohms to 1 kilo ohm, transmit and receive coil inductance variation due to shielding, effects of the battery effects of a magnet used to center the receiving device on the transmitting pad and manufacturing tolerances over the entire range of operating frequency from 110 kHz to 205 kHz.

The WPC defined communication channel assumes that the incoming signal is always amplitude modulated. However, the present inventors have discovered that this information may be lost because of its low value (i.e. 200 mV) which may be further reduced when the power signal level (which can be 70 Vpp) is divided down to a voltage level that can be handled by an integrated circuit, as this signal, which rides on the power signal, will also be reduced. This low level signal can be masked by changes in the load current. Accordingly, the inventors have determined that the signal data may lie within the phase of incoming carrier signal, rather than the amplitude. Therefore, a traditional amplitude demodulator channel is inadequate to solve the problems described above.

Figure 1:
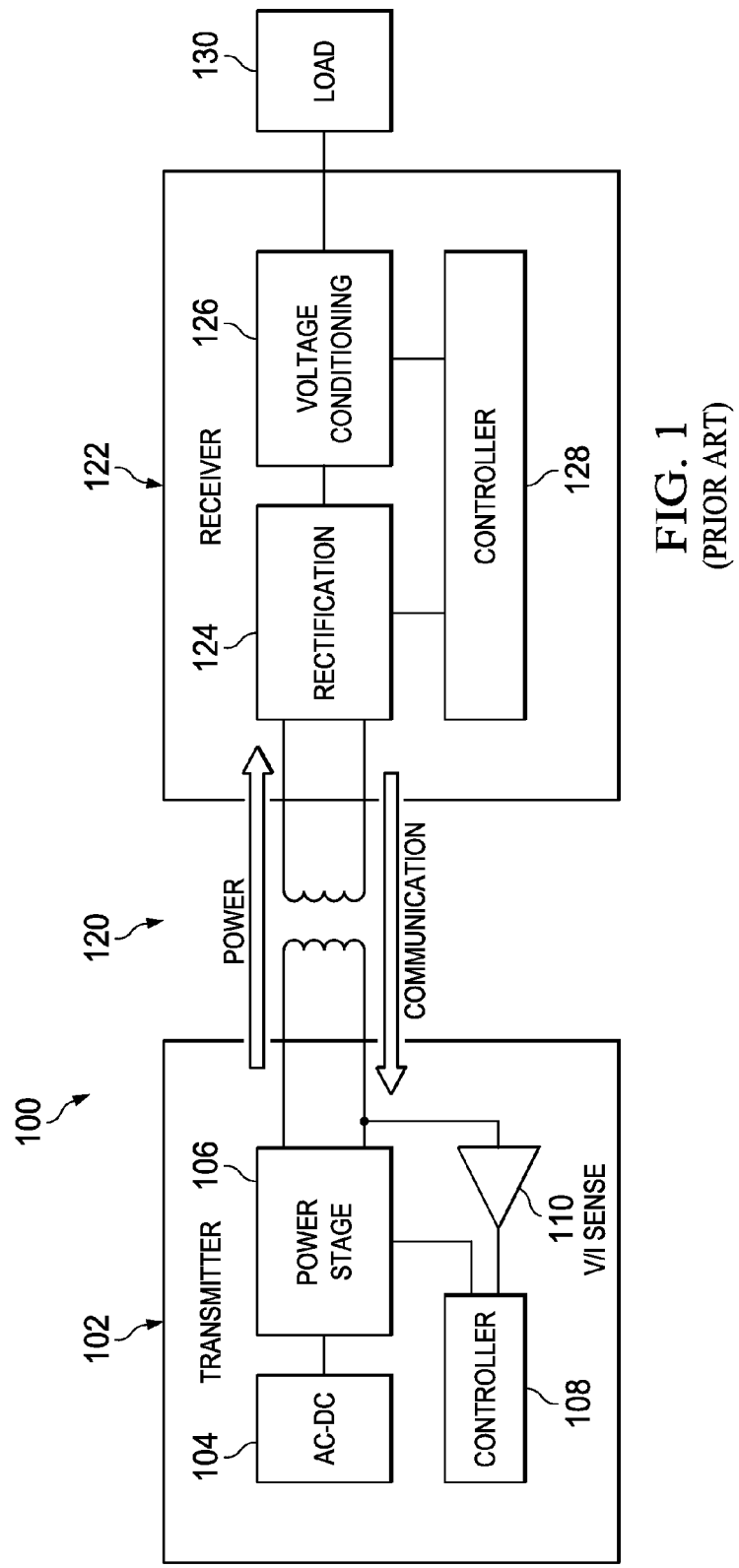
FIG. 1 is a diagram of a wireless power system according to the prior art.
Figure 2:
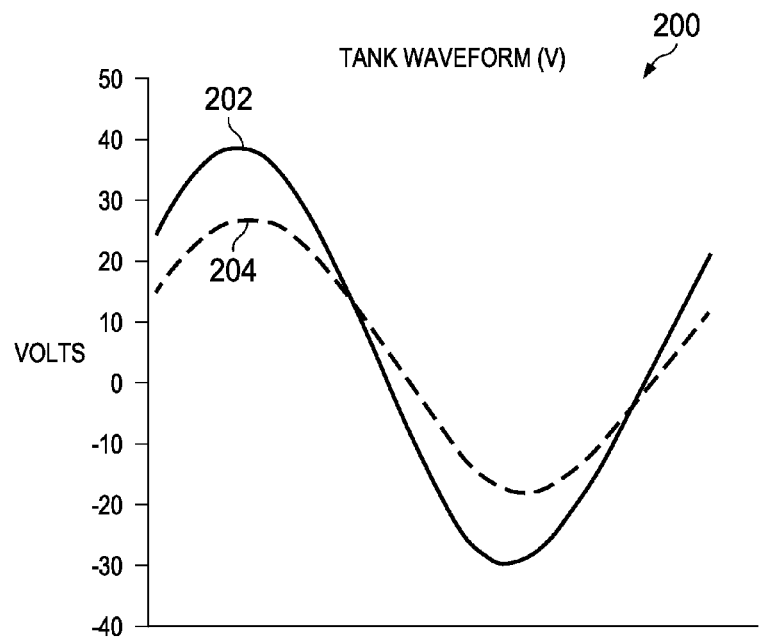
FIG. 2 is a graph showing the tank waveform in a wireless power system.

FIG. 2 shows the tank signal waveform of the power transmitter where data is being sent from the receiver to the transmitter, generally as 200. In FIG. 2, the load resistance is 100 ohms, the coefficient of coupling K is 0.7, the secondary (receiver) side capacitor, utilized to transmit data or commands back to the transmitter (primary) side, is 22 nF. The primary side inductance is 9.36 µH and the secondary side inductance is 16 µH with the circuit having an operating frequency of 155 kHz. Waveform 202 is without the capacitor being coupled across the secondary side of receiver coil and the waveform 204 shows the same signal with the capacitor coupled across the secondary side receive coil to transmit information. Under these circumstances, there is a difference in amplitude between the two waveforms and the information in the signal can be amplitude detected.

Figure 3:
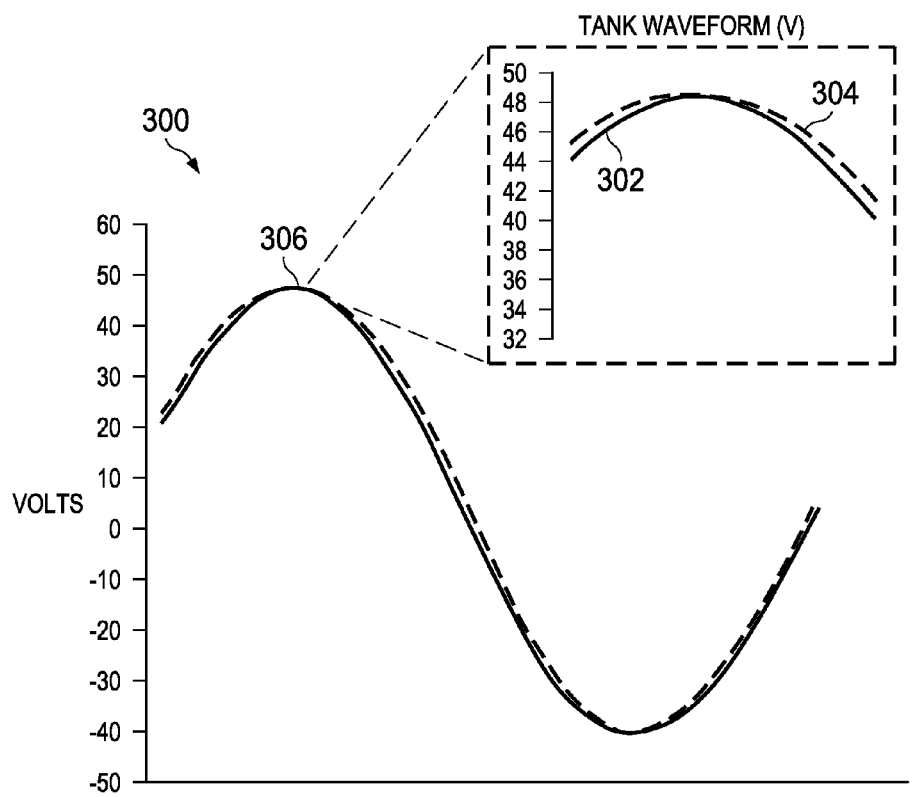
FIG. 3 is a graph showing the tank waveform in which the two signals in a wireless power system have the same amplitude.

FIG. 3 shows the tank signal waveform of a power transmitter generally as 300. In FIG. 3, the load resistance is 5 ohms, the coupling coefficient is 0.2, the capacitance is 22 nF, the primary side inductor is 9.36 µH, the secondary side inductor is 16 µH and the operating frequency is 155 kHz. As can be seen, the peaks of the waveforms with and without capacitance being switched in at the secondary side, are identical at 306. The exploded view shows the signal 302 which is the signal without the capacitor being switched in across the receiver side coil and the signal 304 which shows the capacitor switched in across the coil. Therefore, it may be very difficult to detect the data when the signal peaks are essentially identical utilizing amplitude demodulation.

Figure 4:
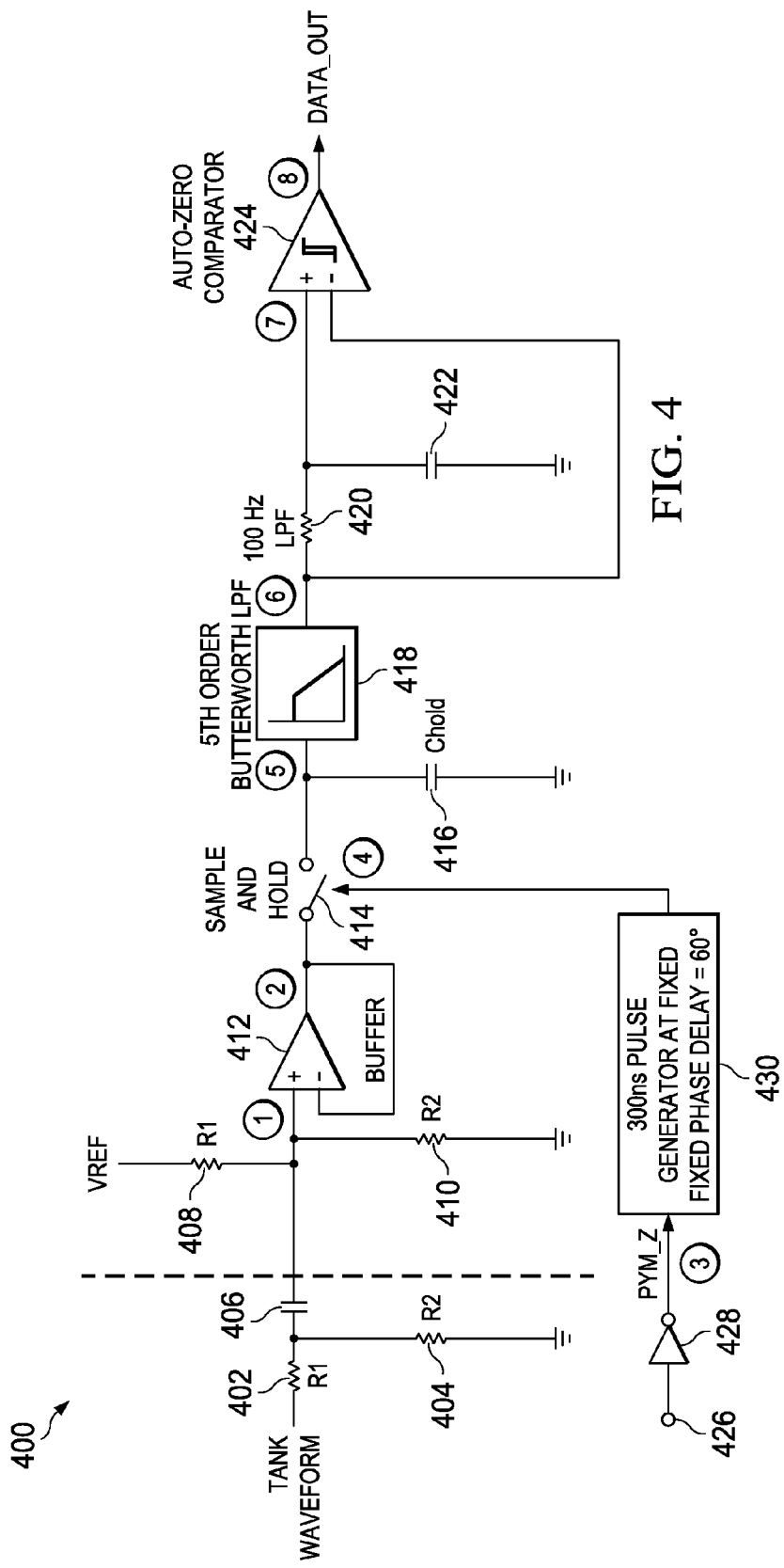
FIG. 4 is a block diagram of an embodiment constructed according to the principles of the present disclosure.

FIG. 4 shows an embodiment of a solution to this problem generally as 400. In FIG. 4, the tank waveform from the transmitter side tank circuit is coupled via resistor divider 402, 404 to a capacitor 406. The resistor divider 402, 404 divides of the voltage across the tank circuit, which may be as much as 70 V peak to peak, to a voltage level that can be handled by an integrated circuit. Capacitor 406 blocks the DC level of the input waveform from affecting the setpoint of a buffer circuit 412, the non-inverting input of which is coupled to the capacitor 406. This allows the setpoint of the buffer 412 to be set via the resistor divider 408, 410 between a reference voltage and ground. The inventors have found it to be advantageous to utilize the voltage just slightly above 0 V, for example, 100 or 200 mV as the setpoint for the buffer 412. In addition, the circuit may be operated at a higher voltage than may be used for other portions of the transmitter circuit, for example 4 V rather than 3.3 V. The combination of these two features allows for an increased voltage swing of the measured data or commands in the signal stream. Buffer 412 has its output coupled to the inverting input thereof so that it has a gain of unity. The output of buffer 412 is coupled to a sample and hold circuit having a switch 414 which stores the value of the tank waveform, after having been buffered by buffer 412, and stored in capacitor 416. The switch 414 in the sample and hold circuit is controlled by the output of the 300 ns pulse generator 430 having a fixed phase delay of 60°. This circuit 430 is driven, in turn, by the excitation signal 426 used to excite the tank circuit in the transmitter via buffer inverter 428. Therefore, the sample of the tank waveform is taken at fixed phase delay of 60° from the excitation signal for the tank waveform. The sample value is stored in capacitor 416 which is coupled between the switch and ground. Voltage across capacitor 416 is filtered by a low pass filter 418, here in a fifth order Butterworth low pass filter. The output of the low pass filter 418 is coupled to the inverting input of an auto zero or low offset comparator 424. The output of the low pass filter 418 is also coupled through RC filter 420, 422 to the non-inverting input of auto zero comparator 424. The resistor 420 is coupled in series between the output of the low pass filter 418 and the non-inverting input of auto zero comparator 424. The capacitor is connected between the non-inverting input of the auto zero comparator 424 and ground. The output of auto zero comparator 424 is the data or command signal. It should be noted that the fixed phase delay can range at least between 15° and 75° without departing from the principles of the present disclosure.

In operation, the coil voltage from the transmit coil in the transmit tank circuit can be sensed directly. This voltage, which can be as high as 70 V peak to peak the varying DC level, is AC coupled to the demodulator signal chain through a resistor divider 402, 404 which reduces the voltage to level it can be handled by an integrated circuit. Depending upon the voltage reduction of the resistor divider 402, 404, the signal to be detected can be 100 mV or lower riding on top of the 10-70 V peak to peak carrier amplitude. Thus it has a very low signal-to-noise ratio (SNR). In addition, the carrier has both positive and negative swings with respect to ground. Therefore, the present invention maximizes the signal amplitude by setting the DC setpoint at the input of amplifier 412 very close to ground, for example 200 mV. This, along with a higher voltage (for example for 4 V) supply for the amplifier 412 allows for a signal swing of almost 4 V.

Figure 6:
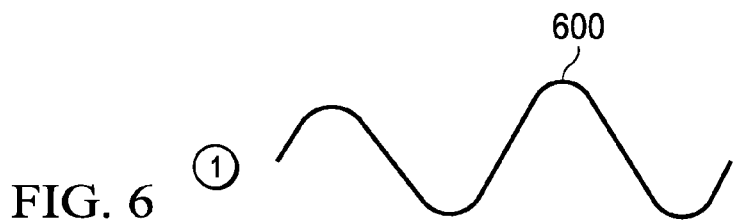
FIGS. 6-12 show waveforms for the circuits illustrated in FIGS. 4 and 5.

The input voltage to the non-inverting terminal of buffer amplifier 412 is shown in FIG. 6, generally as 600.

As can be seen, it is an amplitude (or phase) modulated sine wave of frequency between 110 kHz-205 kHz. The amplitude modulation frequency is 2 kHz. The 600 shows two periods; one just before the modulation and one after the modulation.

Figure 7:
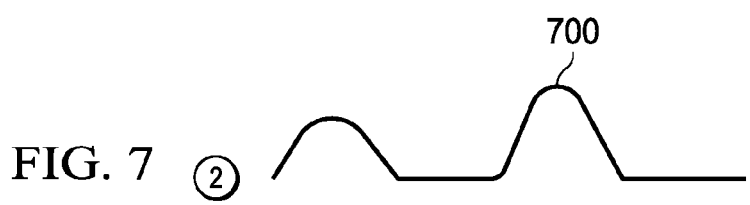
Figure 8:
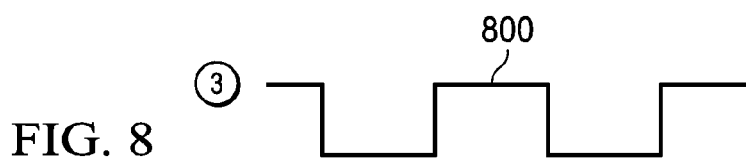
Figure 9:
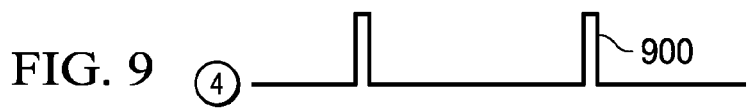

The output of buffer amplifier 412 is shown in FIG. 7 as a half wave rectified sine wave 700. FIG. 8 shows the square wave excitation signal 800 is used to excite the tank circuit in the transmitter side of the power transmission device. This signal is sometimes referred to as a "PWM" signal although it is normally a square wave having a 50% duty cycle. However, under extreme light load conditions, the cycle would be cut back from the 50% level to 10% level in order to reduce the power generated when the need for power at the receiver side is low. FIG. 9 shows the output pulse from the 300 ns pulse generator having a fixed phase delay of 60° generally as 900. Pulse 900 is coupled to the switch 414 of the sample and hold circuit and used to operate the switch to take samples of the output of buffer 412. The samples are held in capacitor 416.

Figure 10:
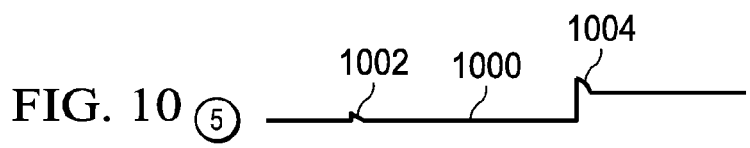
Figure 11:
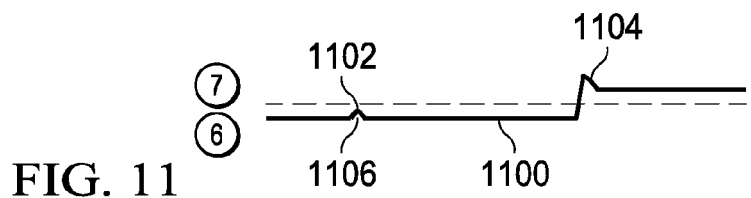
Figure 12:
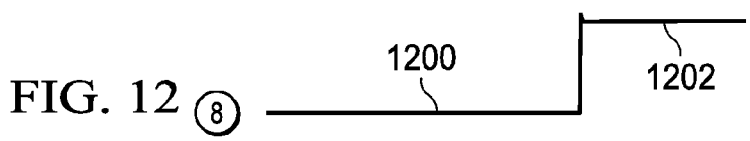

The sampled voltage is shown in FIG. 10 generally as 1000. In order to remove high-frequency noise from the signal, it is passed through a low pass filter, here a fifth order Butterworth low pass filter 418. The output of the Butterworth low pass filter is shown in FIG. 11 generally as 1100. In order to determine the threshold utilized to extract data or commands from signal stream, an RC filter comprising resistor 420 coupled in series between the output of the fifth order Butterworth low pass filter and the non-inverting input of auto zero comparator 424 and a capacitor 422 coupled from the non-inverting input of amplifier 424 to ground is utilized. The threshold 1102 generated by the low pass filter 420, 422 is utilized to extract the data which appears at the output of the auto zero comparator 424. The signal 1106 represents a digital zero and the signal 1104 represents a digital one. The signal 1200 is the output of auto-zero comparator 424, with a digital one output being shown at 1202.

Figure 5:
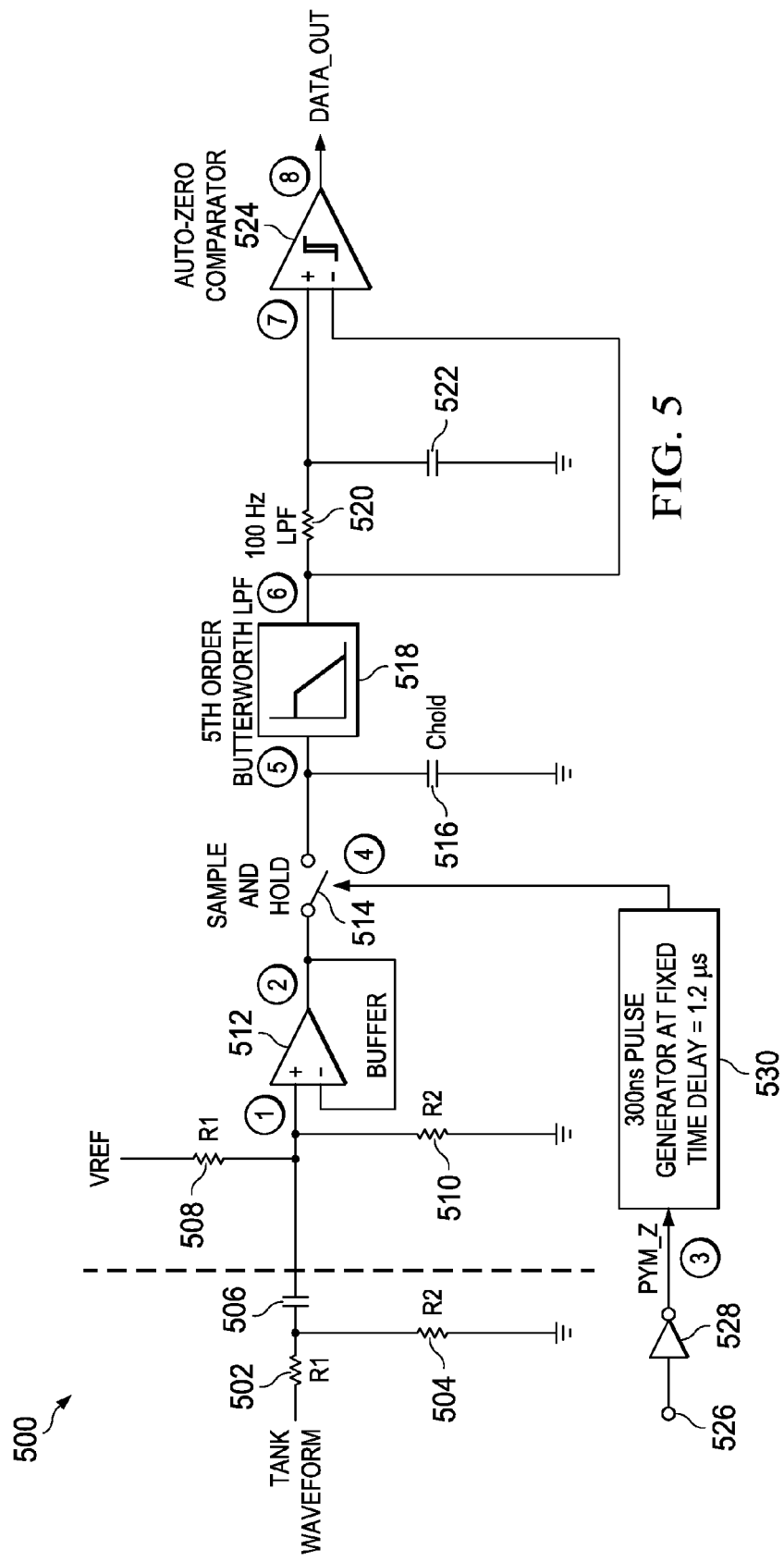
FIG. 5 shows an alternate embodiment constructed according to the principles of the present disclosure.

FIG. 5 shows an alternative embodiment of a solution to this problem generally as 500. In FIG. 5, the tank waveform from the transmitter side tank circuit is coupled via resistor divider 502, 504 to a capacitor 506. The resistor divider 502, 504 divides the voltage across the tank circuit, which may be as much as 70 V peak to peak, to a level that can be handled by an integrated circuit. Capacitor 506 blocks the DC level of the input waveform from affecting the setpoint of a buffer circuit 512, the non-inverting input of which is coupled to the capacitor 506. This allows the setpoint of the buffer 512 to be set via the resistor divider 508, 510 between a reference voltage and ground. The inventors have found it to be advantageous to utilize the voltage just slightly above 0 V, for example, 100 or 200 mV as the setpoint for the buffer 512. In addition, this circuit is operated at a higher voltage than may be used for other portions of the transmitter circuit, for example 4 V rather than 3.3 V. The combination of these two features allows for an increased voltage swing of the measured data or commands in the signal stream. Buffer 512 has its output coupled to the inverting input thereof so that it has a gain of unity. The output of buffer 512 is coupled to a switch of sample and hold circuit 514. The sample and hold circuit 514 is operated by a pulse from pulse generator 530 at a fixed time delay, here shows 1.2 μs. Other time delays can be utilize such as 250 ns to 1.2 μs. Pulse generator 530 is operated by the excitation signal for the tank circuit 526 passing through buffer inverter 528. This signal is sometimes referred to as a "PWM" signal although it is normally a square wave having a 50% duty cycle. However, under extreme light load conditions, the cycle would be cut back from the 50% level to the 10% level in order to reduce the power generated when the need for power at the receiver side is low. A sample value is stored in capacitor 516 which is coupled between the switch and ground.

The voltage across capacitor 516 is filtered by a low pass filter 518. In this embodiment a fifth order Butterworth low pass filter is utilized. The output of the Butterworth low pass filter is shown in FIG. 11 generally as 1100. In order to determine the threshold utilized to extract data or commands from signal stream, an RC filter comprising resistor 520 coupled in series between the output of the fifth order Butterworth low pass filter and the non-inverting input of auto zero comparator 524 and a capacitor 522 coupled from the non-inverting input of amplifier 524 to ground is utilized. The threshold 1102 generated by the low pass filter 520, 522 is utilized to extract the data which appears that the output of the auto-zero comparator 524. The signal 1106 represents a digital zero and the signal 1104 represents a digital one. The signal 1200 is the output of auto-zero comparator 524, with a digital one output being shown at 1202.

The fixed time delay could be 250 ns to 1.2 μs, for example. The pulse generated by the time delay circuits may be 300 ns wide, for example. These circuits are somewhat simpler in construction than a phase delayed pulse generator circuit. Circuits capable of generating such time delayed pulses are well known in the art and need not be discussed further herein. A circuit for the generation of the phase delayed signals can be found in commonly-own application Ser. No. 14/502,048 filed on even date and incorporated herein by reference in its entirety for all purposes. Details on an alternate threshold detection circuit to replace the RC circuit 420,422 or 520,522 can be found in commonly-owned applications Ser. No. 14/501,850 or 14/502,048 filed on even date and incorporated herein by reference in their entirety for all purposes.

Although the invention has been described in detail, it should be understood that various changes, substitutions and alterations can be made thereto without departing from the spirit and scope of the invention as defined by the appended claims.

The invention claimed is:

1. In a primary side wireless power transmitter for being inductively coupled to a secondary side wireless power receiver for supplying power to the wireless power receiver to power a load coupled to the wireless power receiver, a primary side control for receiving communications from the secondary side wireless power receiver through the inductive coupling, comprising:
    a primary side tank circuit being excited into oscillation by excitation signal, the tank circuit receiving a signal stream from the secondary side wireless power receiver;
    a delay circuit generating a fixed delay clock signal from the excitation signal;
    a sample and hold circuit sampling a tank circuit voltage utilizing the fixed delayed clock signal; and
    a comparator coupled to an output of the sample and hold circuit for extracting data or commands from the signal stream.

2. The controller of claim 1 wherein the delay circuit is a phase delay circuit generates a clock signal which has a phase delay of between 15° and 75° with respect to the excitation signal.

3. The controller of claim 2 wherein the output of the sample and hold circuit is filtered by a low pass filter.

4. The controller of claim 3 wherein output of the low pass filter is compared with an average value of the output of the low pass filter to detect data or commands from the secondary side power receiver.

5. The controller of claim 1 wherein the delay circuit that generates a clock is a time delay circuit.

6. The controller of claim 5 wherein the time delay is 250 ns to 1.2 μs.

7. The controller of claim 5 wherein the output of the sample and hold circuit is filtered by a low pass filter.

8. The controller of claim 7 wherein output of the low pass filter is compared with an average value of the output of the low pass filter to detect data or commands from the secondary side power receiver.

9. A method of operating a primary side wireless transmitter inductively coupled to a secondary side wireless power receiver for supplying power to the wireless power receiver to power a load coupled to the receiver comprising:
    exciting a tank circuit into oscillation utilizing at excitation signal;
    receiving a signal stream from the wireless power receiver in a primary side tank circuit;
    generating a fixed delayed clock signal from the excitation signal;
    sampling the tank circuit voltage utilizing the fixed delayed clock and holding the sampled value;
    generating a threshold voltage signal from the signal stream signal; and
    extracting data from the signal stream utilizing the threshold voltage signal.

10. The method of claim 9 wherein the fixed delay is a phase delayed clock that is generated at a fixed delay of between 15° and 75° with respect to the excitation signal.

11. The method of claim 10 wherein the delay circuit that generates a clock is a time delay circuit.

12. The method of claim 11 wherein the time delay is 250 ns to 1.2 μs.

13. The method of claim 11 further comprising low pass filtering the output of the sample and hold circuit.

14. The method of claim 13 further comprising comparing output of the low pass filter with an average value of the output of the low pass filter to detect data or commands from the secondary side receiver.

15. The method of claim 10 further comprising low pass filtering the output of the sample and hold circuit.

16. The method of claim 15 further comprising comparing output of the low pass filter with an average value of the output of the low pass filter to detect data or commands from the secondary side receiver.

17. A wireless power transfer system comprising:
    a transmitter for transmitting electrical energy through a first inductive coil electromagnetically coupled to a second inductive coil in a receiver;
    a circuit in the receiver coupling a resistor or capacitor across the second inductive coil to generate data or command signals in the first inductive coil;
    a sample and hold circuit sampling a value of signal in the first inductive coil and holding the value, the sample being taken at a fixed delay from an excitation signal for the first coil; and
    a comparator coupled to an output of the sample and hold circuit for extracting data or commands from a signal stream.

18. The wireless power transfer system of claim 17 wherein the fixed delay is a phase delay of between 15° and 75° with respect to the expectation signal.

19. The wireless power transfer system of claim 17 wherein the fixed delay circuit is a fixed time delay circuit.

20. The wireless power transfer system of claim 19 wherein the time delay is between 250 ns 1.2 μs.

* * * * *